(12) United States Patent
Fujikawa et al.

(10) Patent No.: US 8,697,555 B2
(45) Date of Patent: Apr. 15, 2014

(54) METHOD OF PRODUCING SEMICONDUCTOR DEVICE AND SEMICONDUCTOR DEVICE

(75) Inventors: Kazuhiro Fujikawa, Osaka (JP); Shin Harada, Osaka (JP); Yasuo Namikawa, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 772 days.

(21) Appl. No.: 12/526,731

(22) PCT Filed: Aug. 21, 2008

(86) PCT No.: PCT/JP2008/064862
§ 371 (c)(1),
(2), (4) Date: Aug. 11, 2009

(87) PCT Pub. No.: WO2009/075124
PCT Pub. Date: Jun. 18, 2009

(65) Prior Publication Data
US 2010/0044721 A1 Feb. 25, 2010

(30) Foreign Application Priority Data
Dec. 12, 2007 (JP) .................................. 2007-320951

(51) Int. Cl.
*H01L 21/265* (2006.01)
(52) U.S. Cl.
USPC ............... 438/522; 257/77; 257/78; 257/614; 257/E21.041; 257/E21.043; 257/E21.054; 257/E21.056; 257/E21.473; 438/473; 438/474; 438/514; 117/217; 117/222; 392/418

(58) Field of Classification Search
USPC .................. 257/77, 78, 614, E21.005, 257/E21.041–E21.043, E21.049, 257/E21.054–E21.056, E21.473; 438/473, 438/474, 514, 522; 117/217, 222; 392/418
See application file for complete search history.

(56) References Cited

U.S. PATENT DOCUMENTS 5,981,900 A    11/1999   Flemish et al.
5,989,340 A * 11/1999   Stephani et al. ............... 117/204
(Continued)

FOREIGN PATENT DOCUMENTS

JP    09-502303 A    3/1997
JP    11-087257 A    3/1999
(Continued)

OTHER PUBLICATIONS

Y. Negoro et al., "Flat Surface after High-Temperature Annealing for Phosphorus-Ion Implanted 4H—SiC (0001) Using Graphite Cap", Materials Science Forum, vols. 457-460, pp. 933-936 (2004).

(Continued)

*Primary Examiner* — Meiya Li
(74) *Attorney, Agent, or Firm* — Venable LLP; Michael A. Sartori; Tamatane J. Aga

(57) ABSTRACT

The invention offers a method of producing a semiconductor device that can suppress the worsening of the property due to surface roughening of a wafer by sufficiently suppressing the surface roughening of the wafer in the heat treatment step and a semiconductor device in which the worsening of the property caused by the surface roughening is suppressed. The method of producing a MOSFET as a semiconductor device is provided with a step of preparing a wafer 3 made of silicon carbide and an activation annealing step that performs activation annealing by heating the wafer 3. In the activation annealing step, the wafer 3 is heated in an atmosphere containing a vapor of silicon carbide generated from the SiC piece 61, which is a generating source other than the wafer 3.

12 Claims, 8 Drawing Sheets

(56) References Cited

U.S. PATENT DOCUMENTS

| | | |
|---|---|---|
| 6,667,102 B1 | 12/2003 | Amy et al. |
| 2008/0213988 A1* | 9/2008 | Shibagaki et al. ............ 438/530 |

FOREIGN PATENT DOCUMENTS

| | | |
|---|---|---|
| JP | 11-274481 | 10/1999 |
| JP | 2004-297034 A | 10/2004 |
| JP | 2005-353771 | 12/2005 |
| JP | 2006-339396 | 12/2006 |
| JP | 2007-281005 A | 10/2007 |
| JP | 2008-166729 | 7/2008 |
| WO | WO 95/06956 | 3/1995 |
| WO | WO-97/39477 | 10/1997 |

OTHER PUBLICATIONS

Caleca et al., "P-Type Doping of SiC by Aluminum Implantation for Advanced Device Applications," Materials Research Society, vol. 410, pp. 63-68 (1996).

Flemish et al., "Ion-Implantation and Activation of Aluminum in 6H—SiC," Journal of the Electrochemical Society, vol. 142, No. 9, pp. L144-L146 (1995).

Negoro et al., "Electronic Behaviors of High-Dose Phosphorous-ion Implanted 4H—SiC (0001)," Journal of Applied Physics, vol. 96, No. 1, pp. 224-228 (2004).

Furusho et al., "Effect of Tantalum in Crystal Growth of Silicon Carbide by Sublimation Close Space Technique," The Japan Society of Applied Physics, vol. 40, pp. 6737-6740 (2001).

\* cited by examiner

METHOD OF PRODUCING SEMICONDUCTOR DEVICE AND SEMICONDUCTOR DEVICE

TECHNICAL FIELD

The present invention relates to a method of producing a semiconductor device and a semiconductor device, more specifically to both a method of producing a semiconductor device that includes a step of performing heat treatment by heating a wafer whose at least one main face is formed of silicon carbide and a semiconductor device produced by the method.

BACKGROUND ART

In recent years, researchers and engineers have been advancing the adoption of silicon carbide (SiC) as a material for forming a semiconductor device in order to enable the semiconductor device, such as a transistor or a diode, to increase the withstand voltage, to decrease the loss, and to operate in a high-temperature environment. Silicon carbide is a wide-band-gap semiconductor having a wider band gap than that of silicon (Si), which has been widely used as the material for forming semiconductor devices. Consequently, by using silicon carbide, in place of silicon, as a material for forming a semiconductor device, the increase in the withstand voltage, the decrease in the on-resistance, and so on of the semiconductor device can be achieved. In addition, a semiconductor device using silicon carbide as the material is advantageous in that the worsening of the property is slight when used in a high-temperature environment in comparison with a semiconductor device using silicon as the material.

Generally, the method of producing a semiconductor device is implemented by combining a step of producing a wafer having a semiconductor layer and a step of heat-treating the wafer. More specifically, the method of producing a semiconductor device employs the following steps, for example. First, a wafer is produced by introducing impurities into a semiconductor layer formed on the substrate by ion implantation or the like. Then, the wafer is heat-treated by heating it to activate introduced impurities (an activation annealing).

When silicon carbide is used as the material for forming the semiconductor device, it is necessary to carry out the activation annealing at a temperature as high as, for example, not less than 1,600° C. When the heat treatment is performed at such a high temperature, however, the surface roughness of the wafer may increase (a phenomenon of surface roughening) or macrosteps may be formed by the coalescence of steps formed by the surface roughening (a phenomenon of step bunching). The above-described worsening of the surface condition adversely affects the property of the semiconductor device produced by using the wafer. In other words, when silicon carbide is used as the material for forming the semiconductor device, there is a problem in that the heat treatment of the wafer performed in the production process worsens the surface condition of the wafer, adversely affecting the property of the semiconductor device.

In order to solve the problem, a method has been proposed in which, first, a carbon (graphite) cap is formed on the surface of a silicon carbide wafer and then the wafer is heat-treated at 1,700° C. This method suppresses the step bunching on the surface of the wafer, thereby suppressing the worsening of the surface condition (see Nonpatent literature 1, for example).

Nonpatent literature 1: Y. Negoro et al., "Flat Surface after High-Temperature Annealing for Phosphorus-Ion Implanted 4H—SiC (0001) Using Graphite Cap," Materials Science Forum, 2004, Vols. 457-460, pp. 933-936.

DISCLOSURE OF THE INVENTION

Problem to be Solved by the Invention

In the method disclosed in the foregoing Nonpatent literature 1, however, although the step bunching is suppressed, the surface roughening is not necessarily suppressed sufficiently. As a result, even when the above-described method is employed in a method producing a semiconductor device, the worsening of the property of the semiconductor device may occur resulting from the surface roughening.

In view of the above circumstances, an object of the present invention is to offer both a method of producing a semiconductor device that can suppress the worsening of the property due to the surface roughening by sufficiently suppressing the surface roughening of the wafer in the heat treatment step and a semiconductor device in which the worsening of the property caused by the surface roughening is suppressed.

Means to Solve the Problem

According to the present invention, the method of producing a semiconductor device is provided with a step of preparing a wafer whose at least one main face is formed of silicon carbide and a step of heat-treating the wafer by heating it. In the step of heat-treating the wafer, the wafer is heated in an atmosphere containing a vapor of silicon carbide generated from a generating source other than the wafer.

The present inventor has studied both the cause of the occurrence of surface roughening in the step of heat-treating the wafer whose surface is formed of silicon carbide and a measure to suppress the surface roughening. As a result, the present inventor has found the following. The surface roughening occurs caused by the sublimation of silicon carbide. When the wafer is heat-treated in an atmosphere containing a vapor of silicon carbide, the sublimation of silicon carbide from the surface of the wafer is suppressed. Thus, it is possible to suppress the surface roughening. Consequently, according to the method of the present invention for producing a semiconductor device, in the step of heat-treating the wafer, the wafer is heated in an atmosphere containing a vapor of silicon carbide generated from a generating source other than the wafer (a silicon carbide-supplying source other than the wafer). As a result, the surface roughening of the wafer can be sufficiently suppressed, and consequently the worsening of the property of the semiconductor device resulting from the surface roughening can be suppressed.

In the above-described method of producing a semiconductor device, it is desirable that in the step of heat-treating the wafer, the wafer be heated in a heating chamber together with a sacrificially sublimable body of which at least the surface is formed of silicon carbide.

When the wafer is heated in an atmosphere containing a vapor of silicon carbide, one of the concrete methods adoptable is to heat the wafer in a heating chamber together with a sacrificially sublimable body whose surface is formed of silicon carbide. When this method is employed, the wafer can be heated in an atmosphere containing a vapor of silicon carbide with ease and without drastically changing the conventional heat-treating equipment. To effectively suppress the sublimation of silicon carbide from the wafer, it is desirable that silicon carbide be sublimated more easily from the sacrificially sublimable body than from the wafer. More specifically, it is desirable that in the heating chamber, the sacrificially sublimable body be placed either in a region where it is heated at a higher temperature than is the wafer or in a region where it is exposed to a larger amount of atmosphere per unit time than is the wafer.

In the above-described method of producing a semiconductor device, the sacrificially sublimable body may be composed of silicon carbide. By using a sacrificially sublimable body composed of silicon carbide, such as a small piece of silicon carbide, the wafer can be heated in an atmosphere containing a vapor of silicon carbide with ease.

In the above-described method of producing a semiconductor device, the sacrificially sublimable body may be provided with a base member and a silicon carbide layer covering the surface of the base member. When this structure is employed, a sacrificially sublimable body having a desired shape can be easily produced by forming, using the chemical vapor deposition (CVD) method, a silicon carbide layer on a base member made of material having high resistance to heat, such as carbon (C), tungsten (W), or tantalum carbide (TaC). Consequently, the sacrificially sublimable body can be easily placed at a desired region in the heat-treating furnace.

In the above-described method of producing a semiconductor device, it is desirable that the wafer be heated under the condition that the wafer is placed on the sacrificially sublimable body such that its other main face, which is the main face opposite to the above-described one main face, is in contact with the sacrificially sublimable body.

When the above-described procedure is realized, the heating is performed under the condition that the wafer is placed on the sacrificially sublimable body such that its main face opposite to the above-described one main face, which is formed of silicon carbide, is in contact with the sacrificially sublimable body. Consequently, the wafer is heated while the above-described one main face is being in contact with an atmosphere containing a large amount of vapor of silicon carbide generated from the sacrificially sublimable body. As a result, the sublimation of silicon carbide from the wafer is effectively suppressed. Accordingly, the surface roughening of the above-described one main face is further suppressed.

In the above-described method of producing a semiconductor device, it is desirable that the wafer be heated under the condition that the sacrificially sublimable body is placed in parallel with the above-described one main face. When the above-described procedure is realized, the wafer is heated while the above-described one main face is being in contact with an atmosphere containing a large amount of vapor of silicon carbide generated from the sacrificially sublimable body. As a result, the sublimation of silicon carbide from the wafer is effectively suppressed. Accordingly, the surface roughening of the above-described one main face is further suppressed.

In this case, it is more desirable that the sacrificially sublimable body be placed so as to cover the above-described one main face with a clearance provided with the wafer. When the above-described procedure is realized, the wafer is heated while the above-described one main face is being in contact with an atmosphere containing a larger amount of vapor of silicon carbide generated from the sacrificially sublimable body. As a result, the sublimation of silicon carbide from the wafer is effectively suppressed. Accordingly, the surface roughening of the above-described one main face is further suppressed.

In the above-described method of producing a semiconductor device, it is desirable that in the step of heat-treating the wafer, the wafer be heated at a temperature range of 1,600° C. or more.

The surface roughening of the wafer eminently occurs particularly when it is heated at a temperature of 1,600° C. or more. Therefore, the above-described semiconductor-device-producing method of the present invention, which can suppress the surface roughening, is suitably applied to the case where the wafer is heated at a temperature range of 1,600° C. or more in the step of heat-treating the wafer. In the case where the wafer is heated at a temperature range exceeding 2,200° C., it is difficult to sufficiently suppress the surface roughening even when the semiconductor-device-producing method of the present invention is applied. Consequently, it is desirable that in the step of heat-treating the wafer, the wafer be heated at a temperature range not more than 2,200° C.

In the above-described method of producing a semiconductor device, it is desirable that in the step of heat-treating the wafer, the wafer be heated under the condition that a cap layer covering the above-described one main face of the wafer is formed on the above-described one main face of the wafer. When the above-described procedure is realized, the surface roughening on the above-described one main face is further suppressed.

In the above-described method of producing a semiconductor device, the above-described cap layer may be composed mainly of carbon with the remainder composed of impurities. A cap layer composed practically of carbon is easy to form and has a high effect of suppressing the surface roughening. Therefore, the providing of the cap layer can further suppress the surface roughening on the above-described one main face with ease.

In the above-described method of producing a semiconductor device, the above-described cap layer may be composed mainly of silicon with the remainder composed of impurities. A cap layer composed practically of silicon, also, has a high effect of suppressing the surface roughening. Therefore, the providing of the cap layer can further suppress the surface roughening on the above-described one main face.

In the above-described method of producing a semiconductor device, it is desirable that the method be further provided with a step of performing ion implantation into the wafer after the step of preparing the wafer and before the step of heat-treating the wafer. In the step of performing ion implantation, the ion implantation is performed under the condition that the wafer is heated at 300° C. or more.

When ion implantation into the wafer is performed before the step of heat-treating the wafer, the subsequent heat treatment can activate impurities introduced into the wafer. When the ion implantation is performed under the condition that the wafer is heated at 300° C. or more, it is possible to suppress the occurrence of the defect resulting from the ion implantation. As a result, the step of heat-treating the wafer can activate impurities with a high rate. When the ion implantation is performed under the condition that the wafer is heated at a temperature exceeding 1,600° C., a problem is caused in that the surface at which the ion implantation is performed is roughened. Therefore, it is desirable that in the step of performing ion implantation into the wafer, the ion implantation be performed under the condition that the wafer is heated at 1,600° C. or below.

A semiconductor device in accordance with the present invention is produced by the above-described method of the present invention for producing a semiconductor device. The semiconductor device of the present invention is produced through the semiconductor-device-producing method of the present invention, which can suppress the worsening of the property resulting from the surface roughening of the wafer by sufficiently suppressing the surface roughening of the wafer in the heat-treating step. Consequently, according to the semiconductor device of the present invention, a semiconductor device can be offered in which the worsening of the property resulting from the surface roughening is suppressed.

Effect of the Invention

As clarified through the above-described explanation, according to the method of the present invention for producing a semiconductor device, a method of producing a semiconductor device can be offered that can suppress the worsening of the property due to the surface roughening of the wafer by sufficiently suppressing the surface roughening of the wafer in the heat treatment step. Furthermore, according to the semiconductor device of the present invention, a semiconductor device can be offered in which the worsening of the property caused by the surface roughening is suppressed.

BEST MODE FOR CARRYING OUT THE INVENTION

Figure 1:
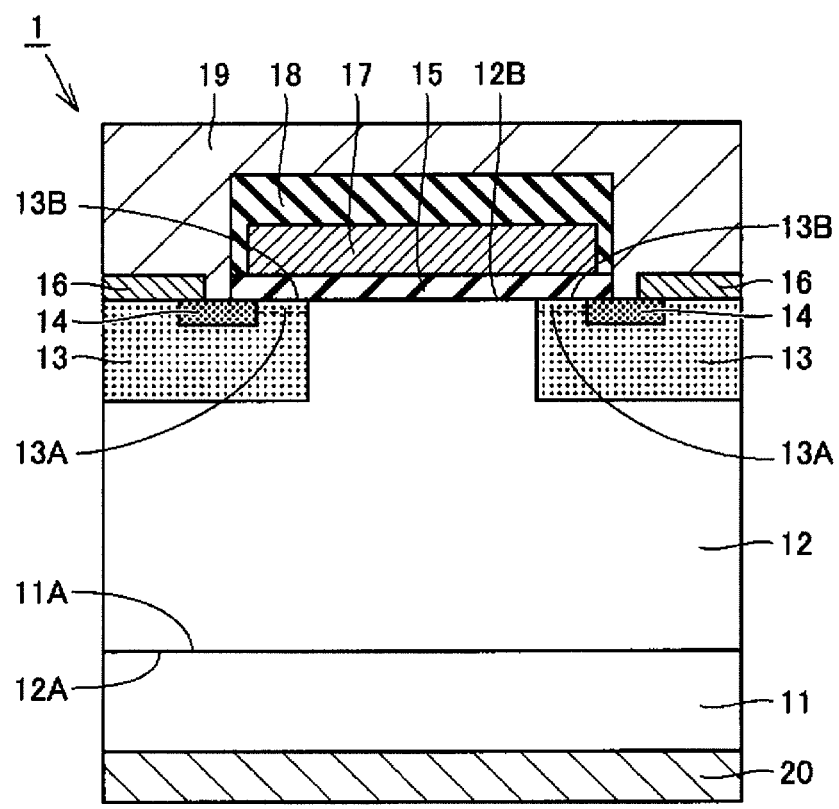
FIG. 1 is a schematic cross-sectional view showing the structure of a MOSFET as the semiconductor device in Embodiment 1.

Embodiments of the present invention are explained below based on the drawing. In the following drawing, the same reference number is given to the same or corresponding portion to eliminate duplicated explanations.

Embodiment 1

FIG. 1 is a schematic cross-sectional view showing the structure of a metal oxide semiconductor field effect transistor (MOSFET) as the semiconductor device in Embodiment 1, which is an embodiment of the present invention. The MOSFET in Embodiment 1 is explained below by referring to FIG. 1.

As can be seen from FIG. 1, a MOSFET 1 in Embodiment 1 is composed of silicon carbide (SiC), which is a wide-bandgap semiconductor, and is provided with an n+SiC substrate 11, whose conductivity type is an n-type (a first conductivity type); an n•SiC layer 12, which is a semiconductor layer whose conductivity type is an n-type (the first conductivity type); a couple of p-type wells 13, which are second-conductivity-type regions whose conductivity type is a p-type (a second conductivity type); and n+source regions 14, which are high-concentration first-conductivity-type regions whose conductivity type is an n-type (the first conductivity type). The n+SiC substrate 11 is composed of hexagonally crystalline SiC and contains a high-concentration n-type impurity (an impurity whose conductivity type is an n-type). The n•SiC layer 12 is formed on one main face of the n+SiC substrate 11 and contains an n-type impurity, so that its conductivity type is an n-type. The n-type impurity contained in the n•SiC layer 12 is, for example, nitrogen (N), and its concentration is lower than that of the n-type impurity contained in the n+SiC substrate 11.

The couple of p-type wells 13 are formed in separation from each other in the SiC layer 12 so as to include a second main face 12B, which is the main face opposite to a first main face 12A, which is the main face at the side of the n+SiC substrate 11. The p-type wells 13 contain a p-type impurity (an impurity whose conductivity type is a p-type), so that their conductivity type is a p-type (the second conductivity type). The p-type impurity contained in the p-type wells 13 is, for example, aluminum (Al) or boron (B), and its concentration is lower than that of the n-type impurity contained in the n+SiC substrate 11.

The n+source regions 14 are each formed in the couple of p-type wells 13 so as to include the second main face 12B and to be enclosed by the p-type wells 13. The n+source regions 14 contain an n-type impurity, which is, for example, P, with a concentration higher than that of the n-type impurity contained in the n•SiC layer 12.

In addition, as can be seen from FIG. 1, the MOSFET 1 is further provided with a gate oxide film 15, which acts as a gate-insulating film; a gate electrode 17; a couple of source-contacting electrodes 16; an interlayer insulating film 18; a source electrode 19; and a drain electrode 20.

The gate oxide film 15 is composed of, for example, silicon dioxide ($SiO_2$) and is formed on the second main face 12B of the n•SiC layer 12 so as to be in contact with the second main face 12B and to extend from the upper face of one of the n+source regions 14 to the upper face of the other n+source region 14.

The gate electrode 17 is placed in contact with the gate oxide film 15 so as to extend from a position right above one of the n+source regions 14 to a position right above the other n+source region 14. The gate electrode 17 is composed of conducting substance such as polysilicon or Al.

Each of the source-contacting electrodes 16 is placed in contact with the second main face 12B so as to extend from a position on one of the couple of n+source regions 14 in the direction away from the gate oxide film 15. The source-contacting electrodes 16 include a material such as nickel silicide (NiSi), which can form ohmic contact with the n+source regions 14.

The interlayer insulating film 18 is composed of insulating substance such as silicon dioxide ($SiO_2$) and is formed right above the second main face 12B so as to enclose the gate electrode 17 and to extend from a position right above one of the p-type wells 13 to a position right above the other p-type well 13.

The source electrode 19 is formed on the second main face 12B so as to enclose the interlayer insulating film 18 and to extend to the upper faces of the n+source regions 14 and the source-contacting electrodes 16. The source electrode 19 is composed of conducting substance such as Al and is electrically connected to the n+source regions 14 through the source-contacting electrodes 16.

The drain electrode 20 is formed directly under the n+SiC substrate 11 so as to be in contact with the other main face opposite to the main face on which the n•SiC layer 12 is formed. The drain electrode 20 includes a material such as NiSi, which can form ohmic contact with the n+SiC substrate 11, and is electrically connected to the n+SiC substrate 11.

Next, the operation of the MOSFET 1 is explained below by referring to FIG. 1. In a state where the voltage of the gate electrode 17 is 0 V, that is, in an off-state, a reverse bias is applied between the p-type wells 13 positioned directly under the gate oxide film 15 and the n•SiC layer 12, so that a nonconducting state is established. On the other hand, when a positive voltage is applied to the gate electrode 17 and the voltage is increased, an inversion layer is formed at channel regions 13A, which are located in the p-type wells 13 and which are regions in contact with the gate oxide film 15. As a result, the n+source regions 14 are electrically connected with the n•SiC layer 12, causing an electric current to flow between the source electrode 19 and the drain electrode 20.

The MOSFET 1 in Embodiment 1 is produced through the below-described method of producing a semiconductor device in Embodiment 1, which is an embodiment of the present invention. Consequently, the surface roughening is suppressed at the channel regions' surfaces 13B, each of which forms an interface between one of the channel regions 13A and the gate oxide film 15, so that the surfaces 13B have high smoothness. As a result, the MOSFET 1 in Embodiment 1 has high carrier mobility in the channel regions 13A, enabling the MOSFET to decrease the on-resistance.

Figure 2:
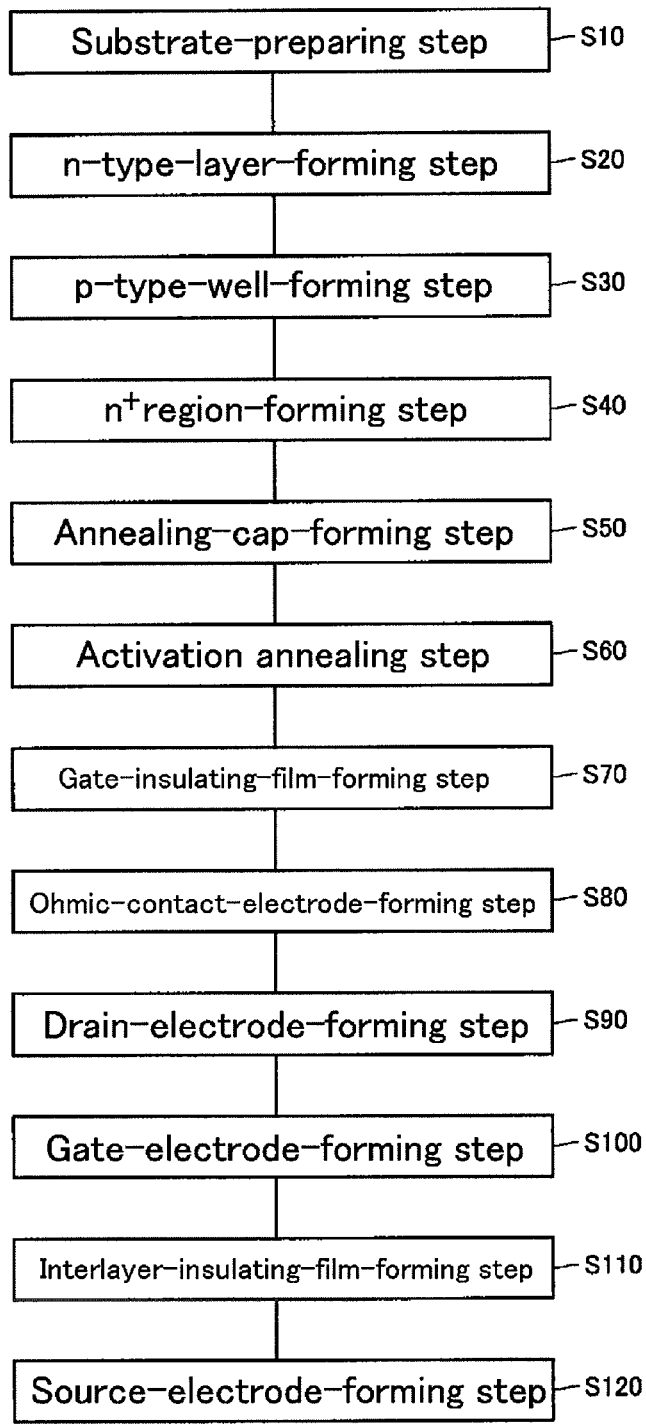
FIG. 2 is a flowchart showing the outline of the method of producing the MOSFET in Embodiment 1.
Figure 8:
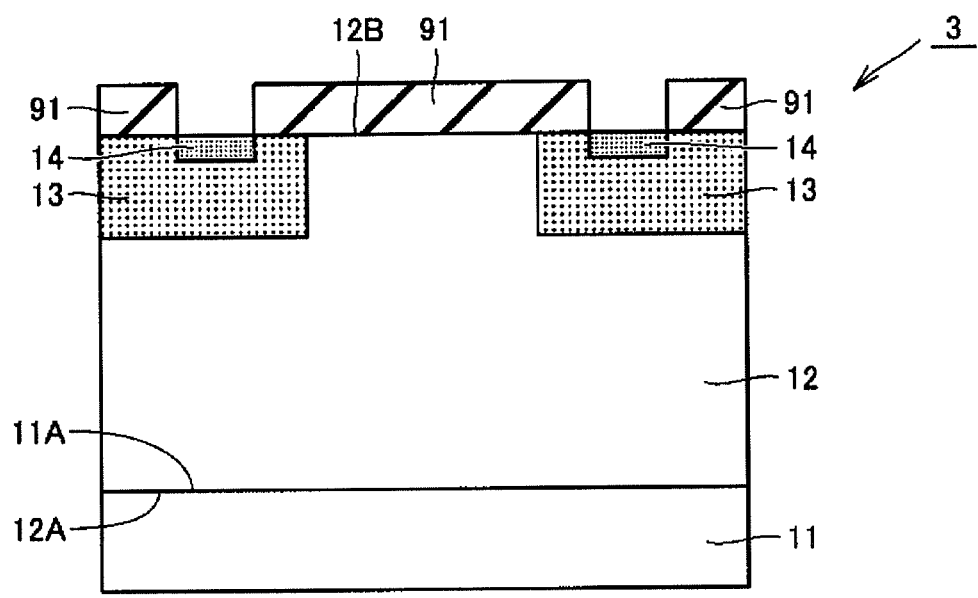
FIG. 8 is a schematic cross-sectional view for explaining the method of producing the MOSFET in Embodiment 1.
Figure 9:
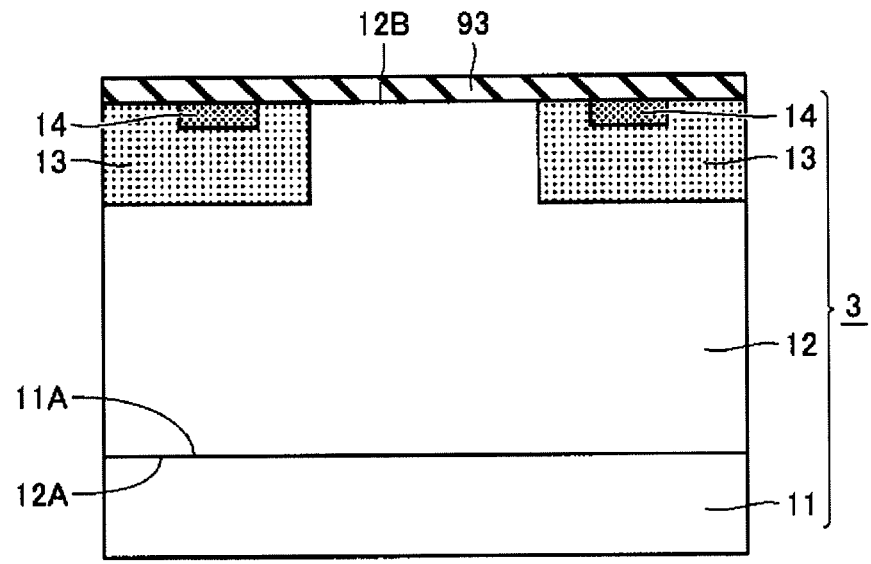
FIG. 9 is a schematic cross-sectional view for explaining the method of producing the MOSFET in Embodiment 1.
Figure 10:
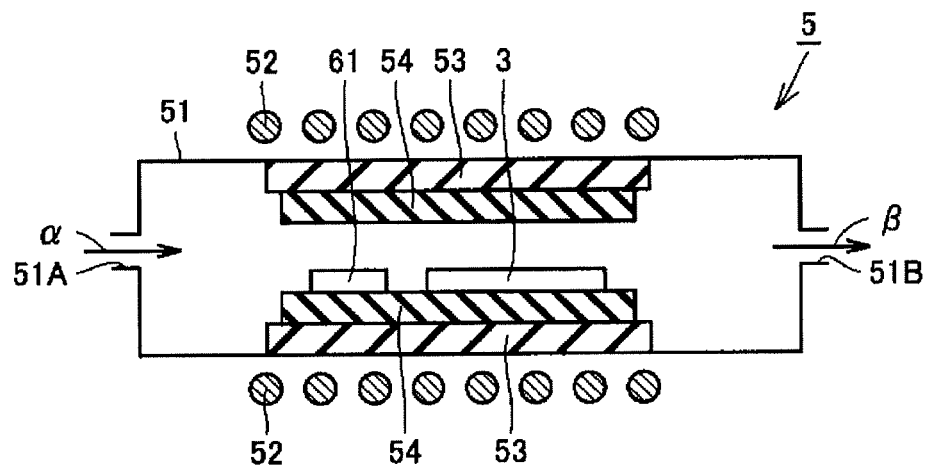
FIG. 10 is a schematic diagram showing the structure of the heat-treating furnace to be used in the activation annealing step in Embodiment 1.

Next, an explanation is given to the method of producing the MOSFET as the semiconductor device in Embodiment 1, which is an embodiment of the method of the present invention for producing a semiconductor device. FIG. 2 is a flowchart showing the outline of the method of producing the MOSFET in Embodiment 1. FIGS. 3 to 9 and 11 are schematic cross-sectional views for explaining the method of producing the MOSFET in Embodiment 1. FIG. 10 is a schematic diagram showing the structure of the heat-treating furnace to be used in the activation annealing step in Embodiment 1.

Figure 3:
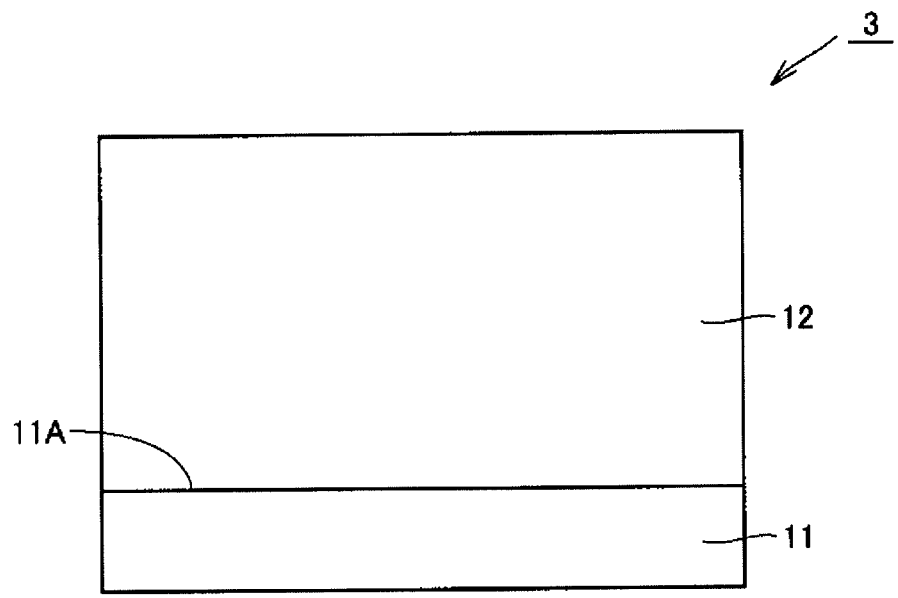
FIG. 3 is a schematic cross-sectional view for explaining the method of producing the MOSFET in Embodiment 1.

As shown in FIG. 2, in the method of producing the MOSFET in Embodiment 1, first, a substrate-preparing step is performed as the step S10. In the step S10, a first-conductivity-type substrate is prepared. More specifically, as shown in FIG. 3, an n+SiC substrate 11 is prepared that is composed of, for example, hexagonally crystalline SiC and that contains an n-type impurity to have an n-type conductivity type.

Next, as shown in FIG. 2, an n-type-layer-forming step is performed as the step S20. In the step S20, a semiconductor layer having a first-conductivity type is formed on the n+SiC substrate 11. More specifically, as shown in FIG. 3, an n•SiC layer 12 is formed on the n+SiC substrate 11 through epitaxial growth. The epitaxial growth can be implemented by using, for example, a mixed gas of silane ($SiH_4$) and propane ($C_3H_8$) as the material gas. At this moment, an n-type impurity, such as nitrogen, is introduced. This process can form an n•SiC layer 12 containing an n-type impurity with a concentration lower than that of the n-type impurity contained in the n+SiC substrate 11. The above-described steps complete the step of preparing a wafer 3 whose at least one main face is formed of silicon carbide.

Figure 4:
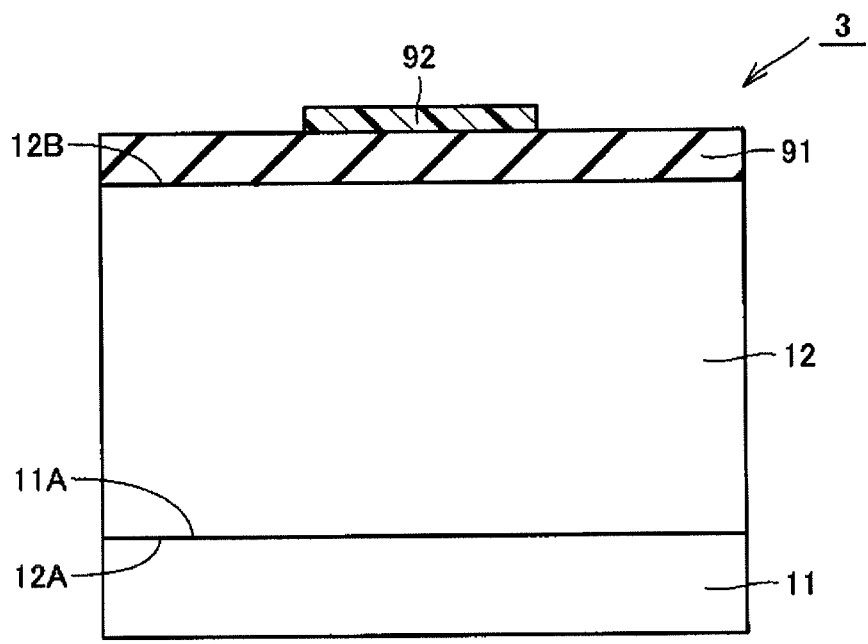
FIG. 4 is a schematic cross-sectional view for explaining the method of producing the MOSFET in Embodiment 1.

Next, as shown in FIG. 2, a p-type-well-forming step is performed as the step S30. In the step S30, in the n•SiC layer 12 of the wafer 3, second-conductivity-type regions are formed so as to include a second main face 12B, which is a main face opposite to a first main face 12A, which is a main face at the side of the n+SiC substrate 11. More specifically, as shown in FIG. 4, first, an oxide film 91 composed of $SiO_2$ is formed on the second main face 12B through, for example, CVD. Subsequently, photoresist is applied onto the oxide film 91, and then exposure to light and development are performed. Thus, a photoresist film 92 is formed that has open areas at regions corresponding to the shape of the p-type wells 13 as the desired second-conductivity-type regions.

Figure 5:
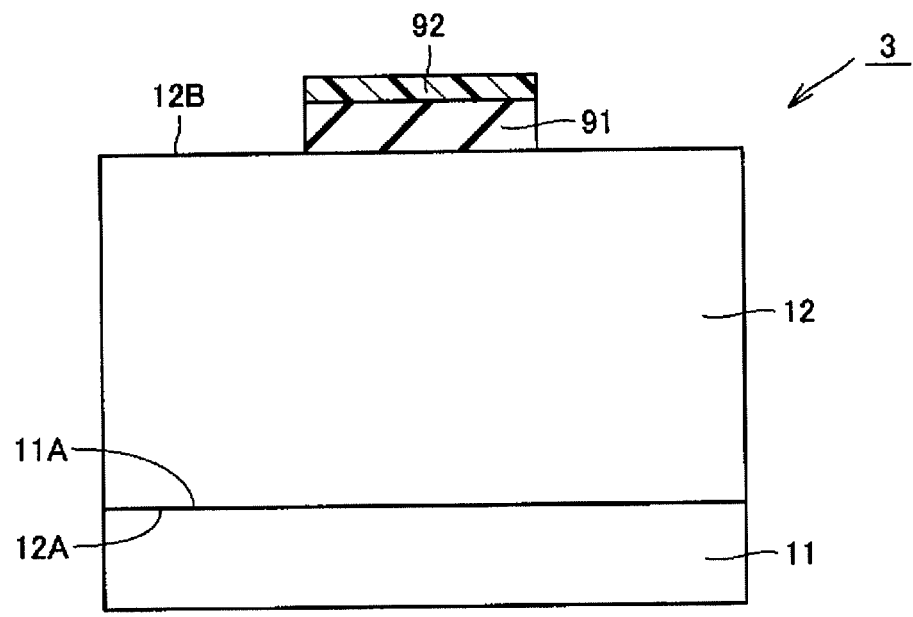
FIG. 5 is a schematic cross-sectional view for explaining the method of producing the MOSFET in Embodiment 1.
Figure 6:
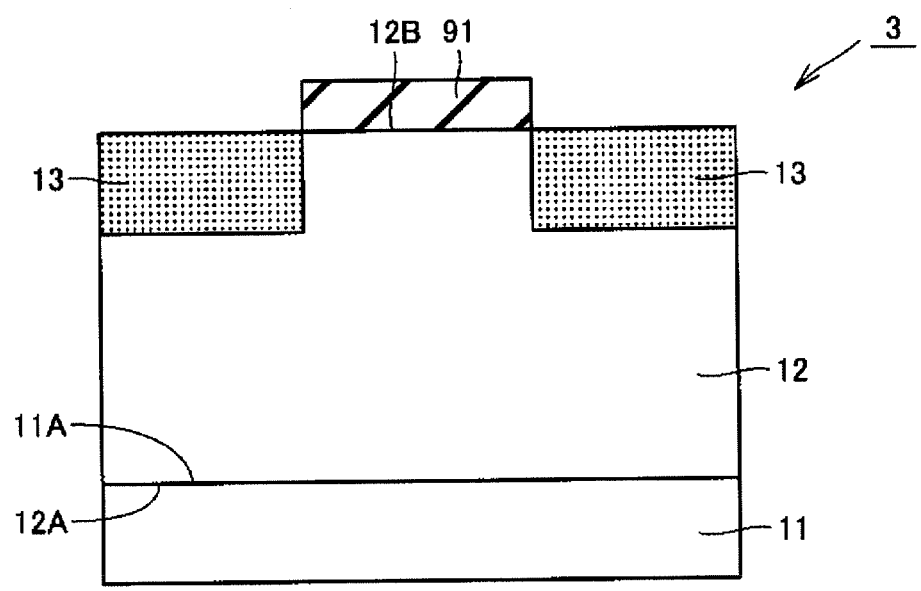
FIG. 6 is a schematic cross-sectional view for explaining the method of producing the MOSFET in Embodiment 1.

Next, as shown in FIG. 5, the oxide film 91 is partially removed through, for example, reactive ion etching (RIE) by using the photoresist film 92 as a mask. Thus, on the n•SiC layer 12, a masking layer is formed using the oxide film 91 having an opening-area pattern. Subsequently, the above-described photoresist film 92 is removed. Then, as shown in FIG. 6, the p-type wells 13 are formed in the n•SiC layer 12 by performing ion implantation into the n•SiC layer 12 using the foregoing masking layer as the mask.

Figure 7:
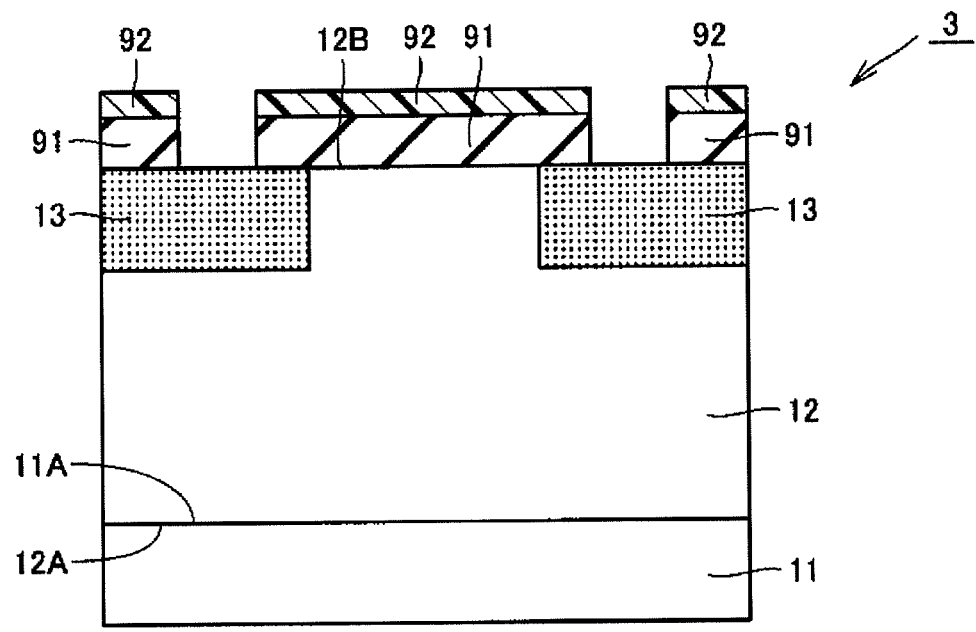
FIG. 7 is a schematic cross-sectional view for explaining the method of producing the MOSFET in Embodiment 1.

Next, as shown in FIG. 2, an n+region-forming step is performed as the step S40. In the step S40, in the regions that are located in the p-type wells 13 and that include the second main face 12B, high-concentration first-conductivity-type regions are formed that contain a first-conductivity-type impurity with a concentration higher than that of the first-conductivity-type impurity contained in the n•SiC layer 12. More specifically, as shown in FIG. 6, first, the oxide film 91 used as the mask in the step S30 is removed. Then, as shown in FIG. 7, another oxide film 91 composed of $SiO_2$ is formed on the second main face 12B through, for example, CVD. Subsequently, photoresist is applied onto the oxide film 91, and then exposure to light and development are performed. Thus, another photoresist film 92 is formed that has openings at regions corresponding to the shape of the n+source regions 14 as the desired high-concentration first-conductivity-type regions.

Subsequently, as shown in FIG. 7, the oxide film 91 is partially removed through, for example, RIE by using the photoresist film 92 as a mask. Thus, on the n•SiC layer 12, a masking layer is formed using the oxide film 91 having an opening pattern. Then, the above-described photoresist film 92 is removed. Next, as shown in FIG. 8, an n-type impurity, such as phosphorus (P), is introduced into the n•SiC layer 12 by performing ion implantation using the foregoing masking layer as the mask. This operation forms the n+source regions 14 as the high-concentration first-conductivity-type regions. The above-described steps complete the step of performing the ion implantation into the wafer 3. In the above-described step of performing the ion implantation, the ion implantation is performed under the condition that the wafer 3 is heated at 300° C. or more.

Next, as shown in FIG. 2, an annealing-cap-forming step is performed as the step S50 that forms a cap layer. In the step S50, a cap layer covering the second main face 12B is formed on the second main face 12B, which is one main face of the wafer 3 that has underwent the step of performing the ion implantation. More specifically, as shown in FIG. 8, first, the oxide film 91 used as the mask in the step S40 is removed. Then as shown in FIG. 9, a cap layer 93 covering the second main face 12B is formed on the second main face 12B.

The cap layer 93 may be, for example, a carbon annealing cap formed by the following process. First, photoresist is applied onto the second main face 12B. Then, the photoresist is heated in an argon (Ar) atmosphere to carbonize it. The formed cap is composed mainly of carbon formed through the carbonization with the remainder composed of impurities. Alternatively, the cap layer 93 may be a silicon annealing cap composed mainly of silicon formed through the sputtering onto the second main face 12B with the remainder composed of impurities.

Next, as shown in FIG. 2, an activation annealing step is performed as the step S60 that performs activation annealing. In the step S60, activation annealing is performed that is a heat treatment to activate, by heating the wafer 3, the impurity introduced into the wafer 3 through the foregoing ion implantation.

In the following, an explanation is given to a heat-treating furnace for performing the activation annealing. As can be seen from FIG. 10, a heat-treating furnace 5 to be used in the step S60 is provided with a heating chamber 51 and a high-frequency coil 52. The heating chamber 51 is provided with a gas inlet 61A, which is an opening for introducing an atmospheric gas into the heating chamber 51, and a gas outlet 51B, which is an opening for discharging the atmospheric gas in the heating chamber 51. In the heating chamber 51, a heat-insulating member 53 composed of heat-insulating material is placed along the inner wall, and a heating element 54 is placed on the heat-insulating member 53. In other words, the heat-insulating member 53 is placed between the inner wall of the heating chamber 51 and the heating element 54. The high-frequency coil 52 is placed so as to enclose the outer wall of the heating chamber 51 and the heating element 54.

Next, an explanation is given to the procedure for implementing the step S60 that uses the heat-treating furnace 5. First, a wafer 3 is prepared that has been provided, in the step S50, with the cap layer 93 on the second main face 12B, which is one main face of the n•SiC layer 12. Then, the wafer 3 is placed on the heating element 54 in the heating chamber 51. Argon (Ar), which is used as the atmospheric gas, is introduced into the heating chamber 51 through the gas inlet 51A, and the atmospheric gas is discharged from the gas outlet 51B. Thus, the atmosphere in the heating chamber 51 is controlled to be an inert atmosphere. On the heating element 54, an SiC piece 61 made of silicon carbide, which is used as a sacrificially sublimable body, is placed at a position closer to the gas inlet 51A than the position at which the wafer 3 is placed. In other words, the position of the SiC piece 61 is located at the upstream side of the gas flow from the gas inlet 51A to the gas outlet 51B. The SiC piece 61 may be, for example, an SiC sintered body. Alternatively, it may be produced by forming, through CVD, a silicon carbide layer on a base member made of carbon (C) such that the silicon carbide layer covers the surface of the base member.

Next, the heating element 54 is induction-heated by applying a high-frequency voltage to the high-frequency coil 52. The wafer 3 and the SiC piece 61 are heated by the heated heating element 54. The wafer 3 may be heated at a temperature of, for example, 1,700° C., which is a temperature not less than 1,600° C. At this moment, the heating operation sublimates the SiC piece 61 on the heating element 54, thereby producing a vapor of silicon carbide in the heating chamber 51. As a result, the wafer 3 is heated in an atmosphere containing a vapor of silicon carbide generated from the SiC piece 61, which is a generating source other than the wafer 3, under the condition that the cap layer 93 covering the second main face 12B is formed on the second main face 12B, which is one main face of the wafer 3. The heating of the wafer activates the impurity introduced into the wafer 3 through the foregoing ion implantation, while sufficiently suppressing the surface roughening of the wafer 3. The above-described steps complete the step of heat-treating the wafer 3.

Next, as shown in FIG. 2, the following steps are performed successively:
S70: a gate-insulating-film-forming step;
S80: an ohmic-contact-electrode-forming step;
S90: a drain-electrode-forming step;
S100: a gate-electrode-forming step;
S110: an interlayer-insulating-film-forming step; and
S120: a source-electrode-forming step.

Figure 11:
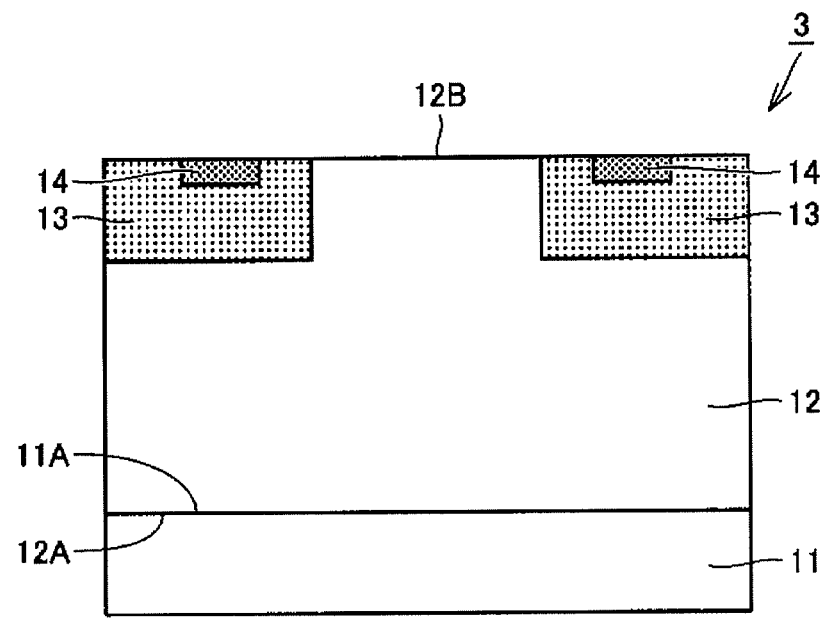
FIG. 11 is a schematic cross-sectional view for explaining the method of producing the MOSFET in Embodiment 1.

In the gate-insulating-film-forming step to be performed as the step S70, first, the wafer 3 having underwent the step S60 as shown in FIG. 9 is heated, for example, at 950° C. in an oxygen atmosphere. As shown in FIG. 11, this heating removes the cap layer 93 formed in the step S50. Then, the exposed second main face 12B is heat-oxidized. Thus, as shown in FIG. 1, a gate oxide film 15 as the gate-insulating film composed of silicon dioxide ($SiO_2$) is formed on the second main face 12B of the n•SiC layer 12 so as to be in contact with the second main face 12B and to extend from the upper face of one of the n+source regions 14 to the upper face of the other n+source region 14.

In the ohmic-contact-electrode-forming step to be performed as the step S80, nickel (Ni) films formed, for example, by the evaporation method are heated to form silicides. Thus, as shown in FIG. 1, a couple of source-contacting electrodes 16 are produced that include nickel silicide (NiSi) and that form ohmic contact with the n+source regions 14. Each of the source-contacting electrodes 16 is formed so as to be in contact with the second main face 12B and to extend from a position on one of the n+source regions 14 in the direction away from the gate oxide film 15.

In the drain-electrode-forming step to be performed as the step S90, a nickel (Ni) film formed, for example, by the evaporation method is heated to form silicides. Thus, as shown in FIG. 1, a drain electrode 20 including NiSi, which can form ohmic contact with the n+SiC substrate 11, is formed so as to be in contact with the other main face of the n+SiC substrate 11, which is the other main face opposite to the main face on which the n•SiC layer 12 is formed.

In the gate-electrode-forming step to be performed as the step S100, a gate electrode 17 composed of polysilicon, which is a conducting substance, is produced through, for example, the CVD method. As shown in FIG. 1, the gate electrode 17 is formed so as to be in contact with the gate oxide film 15 and to extend from a position right above one of the n+source regions 14 to a position right above the other n+source region 14.

In the interlayer-insulating-film-forming step to be performed as the step S110, an interlayer insulating film 18 composed of $SiO_2$, which is an insulating substance, is produced through, for example, the CVD method. As shown in FIG. 1, the interlayer insulating film 18 is formed right above the second main face 12B so as to enclose the gate electrode 17 and to extend from a position right above one of the p-type wells 13 to a position right above the other p-type well 13.

In the source-electrode-forming step to be performed as the step S120, a source electrode 19 composed of Al, which is a conducting substance, is produced through, for example, the evaporation method. As shown in FIG. 1, the source electrode 19 is formed on the second main face 12B so as to enclose the interlayer insulating film 18 and to extend to the upper faces of the n+source regions 14 and the source-contacting electrodes 16. The above-described steps S10 to S120 complete the method of producing the MOSFET 1 as the semiconductor device in Embodiment 1. Thus, the production of the MOSFET 1 (see FIG. 1) in Embodiment 1 is completed.

In the method of producing the MOSFET in Embodiment 1, in the activation annealing step performed as the step S60, the wafer 3 is heated in an atmosphere containing a vapor of silicon carbide generated from the SiC piece 61, which is a generating source other than the wafer 3, under the condition that the cap layer 93 covering the second main face 12B is formed on the second main face 12B, which is one main face of the wafer 3. The heating of the wafer 3 activates the impurity introduced into the wafer 3, while sufficiently suppressing the surface roughening of the second main face 12B of the wafer 3. As a result, the surface roughening is suppressed at the channel regions' surfaces 13B, each of which forms an interface between the channel region 13A and the gate oxide film 15 as shown in FIG. 1, so that the surfaces 13B can secure high smoothness. Consequently, this method suppresses the worsening of the property of the semiconductor device caused by the surface roughening. In other words, this method suppresses the decrease in the carrier mobility in the channel regions 13A, enabling the production of the MOSFET 1 that can decrease the on-resistance.

Embodiment 2

Figure 12:
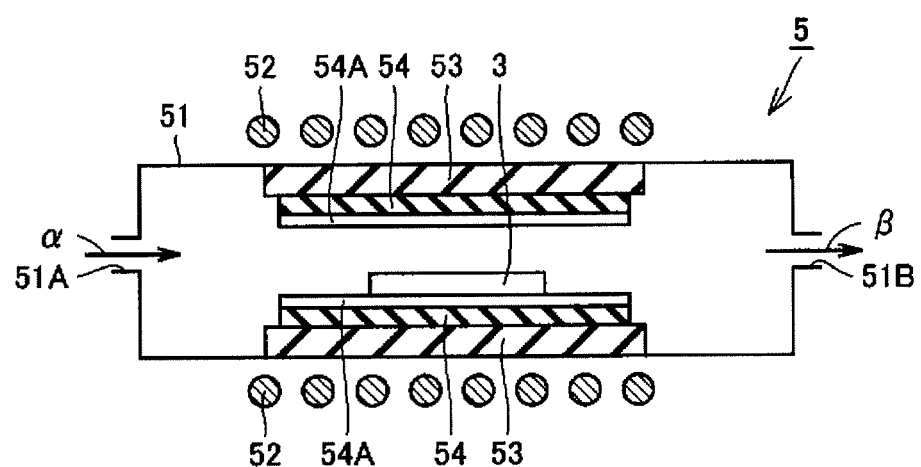
FIG. 12 is a schematic diagram showing the structure of the heat-treating furnace to be used in the activation annealing step in Embodiment 2.

Next, an explanation is given to the method of producing the semiconductor device in Embodiment 2, which is another embodiment of the present invention. FIG. 12 is a schematic diagram showing the structure of the heat-treating furnace to be used in the activation annealing step in Embodiment 2. The method of producing the MOSFET as the semiconductor device in Embodiment 2 is implemented through the procedure basically similar to that in Embodiment 1. Nevertheless, the structure of the heat-treating furnace of Embodiment 2 to be used in the activation annealing step performed as the step S60 shown in FIG. 2 is different from that of Embodiment 1, as shown in FIG. 12. As a result, Embodiment 2 has some difference in the activation annealing step from Embodiment 1. More specifically, as can be seen from FIG. 12, the heating element 54 of the heat-treating furnace 5 to be used in the step S60 in Embodiment 2 has, on its surface, a sacrificially sublimable layer 54A composed of SiC. The wafer 3 is placed on the sacrificially sublimable layer 54A of the heating element 54. In the step S60 in Embodiment 2, as shown in FIGS. 9 and 12, the wafer 3 is heated under the condition that it is placed on the sacrificially sublimable layer 54A such that the main face opposite to the second main face 12B, which is one main face, is in contact with the sacrificially sublimable layer 54A, which is a sacrificially sublimable body.

In this arrangement, the sacrificially sublimable layer 54A provided on the heating element 54 is heated at a temperature higher than that of the wafer 3. Consequently, the SiC constituting the sacrificially sublimable layer 54A is sublimated prior to the SiC constituting the wafer 3. As a result, the wafer 3 is heated while the second main face 12B of the wafer 3 is being in contact with an atmosphere containing a large amount of SiC vapor generated from the sacrificially sublimable layer 54A. Therefore, the sublimation of SiC from the wafer 3 is effectively suppressed. Accordingly, the surface roughening of the second main face 12B is further suppressed.

The above-described heating element 54 having, on its surface, the sacrificially sublimable layer 54A composed of SiC can be produced by forming the sacrificially sublimable layer 54A composed of SiC, through CVD, on the heating element's base material composed of, for example, carbon (C).

Embodiment 3

Figure 13:
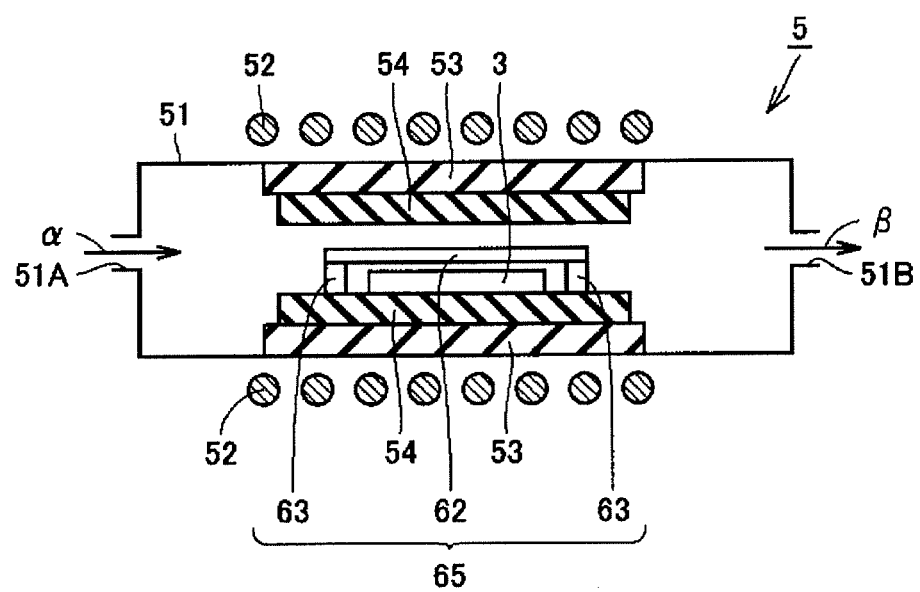
FIG. 13 is a schematic diagram showing the structure of the heat-treating furnace to be used in the activation annealing step in Embodiment 3.

Next, an explanation is given to the method of producing the semiconductor device in Embodiment 3, which is yet another embodiment of the present invention. FIG. 13 is a schematic diagram showing the structure of the heat-treating furnace to be used in the activation annealing step in Embodiment 3. The method of producing the MOSFET as the semiconductor device in Embodiment 3 is implemented through the procedure basically similar to that in Embodiment 1. Nevertheless, Embodiment 3 differs from Embodiment 1 in the activation annealing step performed as the step S60, shown in FIG. 2.

More specifically, as can be seen from FIG. 13, in the step S60 in Embodiment 3, first, the wafer 3, which has been provided with the cap layer 93 in the step S50, is placed on the heating element 54 in the heating chamber 51. In addition, a lid member 65 having the shape of a lid is placed on the heating element 54 so as to cover the wafer 3. The lid member 65 is provided with an SiC plate 62, which is used as a sacrificially sublimable body made of SiC and which has the shape of a flat plate, and foot portions 63, which are connected to the SiC plate 62 and extend in the direction perpendicular to the main face of the SiC plate 62. The length of the foot portions 63 is larger than the thickness of the wafer 3. Supported by the foot portions 63 against the heating element 54, the lid member 65 is placed so as to cover the wafer 3 without touching the wafer 3. In this arrangement, the SiC plate 62 is placed in parallel with the second main face 12B so that its main face can face the second main face 12B of the wafer 3. The material of the foot portions 63 is not particularly limited; the foot portions 63 may either be composed of SiC as with the SiC plate 62 or be formed unitarily with the SiC plate 62.

In the step S60 in Embodiment 3, as shown in FIG. 13, the wafer 3 is heated under the condition that the SiC plate 62 as the sacrificially sublimable body is placed in parallel with the second main face 12B, which is one main face of the wafer 3, and the SiC plate 62 is placed so as to cover the wafer 3 with a clearance provided with the wafer 3.

In this arrangement, the wafer 3 is heated while the second main face 12B, which is one main face of the wafer 3, is being in contact with the atmosphere containing a large amount of SiC vapor generated from the SiC plate 62 as the sacrificially sublimable body. As a result, the sublimation of SiC from the wafer is effectively suppressed. Accordingly, the surface roughening of the second main face 12B is further suppressed.

Example 1

Example 1 of the present invention is explained below. As with Embodiment 3 of the present invention, the annealing-cap-forming step and the activation annealing step were performed as an experiment to examine the condition of the occurrence of the surface roughening of the wafer. The procedure of the experiment is explained below.

First, an SiC wafer made of SiC was prepared. Aluminum (Al) ions were ion-implanted into the SiC wafer. Photoresist was applied to the surface of the wafer to obtain a resist layer having a thickness of 3 μm. The wafer was heated at 750° C. for 15 minutes in an Ar atmosphere. The heating process carbonized the photoresist to form a cap layer (the annealing-cap-forming step). Next, as with Embodiment 3, as shown in FIG. 13, the wafer 3 was placed on the heating element 54 in the heating chamber 51 of the heat-treating furnace 5. The wafer 3 was covered with the lid member 65 formed of an SiC sintered body. Under this condition, Ar gas was introduced through the gas inlet 51A and discharged from the gas outlet 51B. Thus, the heating chamber 51 was filled with an Ar atmosphere. Next, the heating element 54 was heated by applying a high-frequency voltage to the high-frequency coil 52. A plurality of wafers 3 and lid members 65 prepared as described above were heated for 30 minutes at different temperatures of 1,500° C. to 1,800° C. (the activation annealing step). Subsequently, the cap layer was removed by heating the wafer 3 at 950° C. for 30 minutes in an oxygen atmosphere. The condition of the wafer 3's main face whose cap layer had been removed was examined under a scanning electron microscope (SEM) (Example).

On the other hand, for comparison, an activation annealing step outside the scope of the present invention was performed by omitting the procedure of covering the wafer 3 using the lid member 65 in the same step as that of the above-described Example, with the other procedures unchanged from the above-described Example. Then, as with Example, the cap layer was removed to examine the condition of the main face of the wafer 3 (Comparative example).

The results of the experiment are explained below. Table I shows the results of the foregoing experiment. In Table I, the temperature shows the heating temperature in the activation annealing step. Table I shows the results of the examination for the condition of the main face (the top surface) of the wafer. In the case where the surface has the same condition as that of the surface directly after the ion implantation, the result is judged that no surface roughening occurs and is marked as "satisfactory." In contrast, in the case where the surface has the condition obviously different from that of the surface directly after the ion implantation such that an infinite number of dimples are formed on the surface, the result is judged that surface roughening occurs and is marked as "unsatisfactory."

TABLE I

|  | 1,500° C. | 1,600° C. | 1,700° C. | 1,800° C. |
|---|---|---|---|---|
| Example | Satisfactory | Satisfactory | Satisfactory | Satisfactory |
| Comparative example | Satisfactory | Unsatisfactory | Unsatisfactory | Unsatisfactory |

Satisfactory: no surface roughening occurs
Unsatisfactory: surface roughening occurs.

As can be seen from Table I, in Example of the present invention, surface roughening does not occur at all heating-temperature conditions of 1,500° C. to 1,800° C. in the activation annealing step. In contrast, in Comparative example, which lies at the outside of the scope of the present invention, surface roughening occurs at heating temperatures of 1,600° C. and beyond. This result confirms that the method of the present invention for producing a semiconductor device can sufficiently suppress surface roughening of the wafer even when the wafer is heated at a temperature as high as 1,600° C. or more in the heat-treating step (the activation annealing step). Accordingly, the result confirms that the method can suppress the worsening of the property caused by the surface roughening.

In the above-described Embodiments, the method of the present invention for producing a semiconductor device and the semiconductor device of the present invention are explained by using a MOSFET as an example. However, the semiconductor device that can be produced through the method of the present invention for producing a semiconductor device is not limited to a MOSFET. The types of semiconductor device to be produced through the method of the present invention for producing a semiconductor device include a junction field effect transistor (a JFET), a Schottky barrier diode, a p-n diode, and an insulated gate bipolar transistor (an IGBT).

It is to be considered that the above-disclosed embodiments and example are illustrative and not restrictive in all respects. The scope of the present invention is shown by the scope of the appended claims, not by the above-described explanation. Accordingly, the present invention is intended to cover all revisions and modifications included within the meaning and scope equivalent to the scope of the claims.

INDUSTRIAL APPLICABILITY

The method of the present invention for producing a semiconductor device and the semiconductor device of the present invention can be applied particularly advantageously both to the method of producing a semiconductor device that includes a step of performing a heat treatment by heating a wafer whose at least one main face is formed of silicon carbide and to a semiconductor device produced by the method.

The invention claimed is:

1. A method of producing a silicon carbide semiconductor device, the method comprising the steps of:
    (a) preparing a wafer whose at least one main face is formed of silicon carbide; and
    (b) heat-treating the wafer by heating it;
        wherein in the step of heat-treating the wafer, the wafer is heated in an atmosphere containing a vapor of silicon carbide generated from a sacrificially sublimable body other than the wafer and Ar gas introduced through a gas inlet and discharged from a gas outlet, the wafer is set between the gas inlet and the gas outlet, the sacrificially sublimable body is placed so that silicon carbide is sublimated more easily from the sacrificially sublimable body than from the wafer, and the step of heat-treating the wafer is a step of activation annealing of the wafer.

2. The method of producing the silicon carbide semiconductor device as defined by claim 1, wherein at least a surface of the sacrificially sublimable body is formed of silicon carbide.

3. The method of producing the silicon carbide semiconductor device as defined by claim 2, wherein the sacrificially sublimable body is composed of silicon carbide.

4. The method of producing the silicon carbide semiconductor device as defined by claim 2, wherein the sacrificially sublimable body comprises a base member and a silicon carbide layer covering a surface of the base member.

5. The method of producing the silicon carbide semiconductor device as defined by claim 2, wherein the wafer is heated under the condition that the wafer is placed on the sacrificially sublimable body such that the wafer's other main face, which is the main face opposite to the one main face, is in contact with the sacrificially sublimable body.

6. The method of producing the silicon carbide semiconductor device as defined by claim 2, wherein in the step of heat-treating the wafer, the sacrificially sublimable body is placed in parallel with the one main face so as to cover the wafer.

7. The method of producing the silicon carbide semiconductor device as defined by claim 1, wherein in the step of heat-treating the wafer, the wafer is heated at a temperature range of 1,600° C. or more.

8. The method of producing the silicon carbide semiconductor device as defined by claim 1, the method further comprising a step of covering the one main face of the wafer with a cap layer before the step of heat-treating the wafer.

9. The method of producing the silicon carbide semiconductor device as defined by claim 8, wherein the cap layer is composed mainly of carbon with the remainder composed of impurities.

10. The method of producing the silicon carbide semiconductor device as defined by claim 8, wherein the cap layer is composed mainly of silicon with the remainder composed of impurities.

11. The method of producing the silicon carbide semiconductor device as defined by claim 1, the method further comprising a step of performing ion implantation into the wafer after the step of preparing the wafer and before the step of heat-treating the wafer;
   wherein in the step of performing ion implantation, the wafer is heated at 300° C. or more.

12. A silicon carbide semiconductor device produced by the method of producing the silicon carbide semiconductor device as defined by claim 1.

* * * * *